(12) United States Patent
Peng et al.

(10) Patent No.: US 8,836,830 B2
(45) Date of Patent: Sep. 16, 2014

(54) FLEXIBLE PRINTED CIRCUIT BOARD ASSEMBLY WITH STIFFENER AND CAMERA MODULE

(71) Applicant: Hong Fu Jin Precision Industry (ShenZhen) Co., Ltd., Shenzhen (CN)

(72) Inventors: Shu-Sheng Peng, Shenzhen (CN); Wen-Chang Chen, New Taipei (TW); Li-Min Liu, Shenzhen (CN); Yu-Tsan Cheng, New Taipei (TW); Wen-Hsiung Chen, New Taipei (TW); Shin-Wen Chen, New Taipei (TW); Yong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 75 days.

(21) Appl. No.: 13/727,454

(22) Filed: Dec. 26, 2012

(65) Prior Publication Data

US 2014/0036116 A1 Feb. 6, 2014

(30) Foreign Application Priority Data

Aug. 2, 2012 (CN) .......................... 2012 1 0272838

(51) Int. Cl.
*H04N 5/335* (2011.01)
*H04N 5/225* (2006.01)
*H05K 1/02* (2006.01)

(52) U.S. Cl.
CPC ............. *H04N 5/335* (2013.01); *H05K 1/0277* (2013.01)

USPC .......................................... 348/294; 348/373

(58) Field of Classification Search
CPC .................. H01L 27/14618; H04N 1/00307; H04N 2101/00; H04N 5/2251; H04N 5/335; H05K 1/0277
USPC .................................. 348/294, 340, 373–374
See application file for complete search history.

(56) References Cited

U.S. PATENT DOCUMENTS

| | | | |
|---|---|---|---|
| 7,734,314 B2* | 6/2010 | Ryu et al. | 455/566 |
| 7,997,812 B2* | 8/2011 | Kim | 396/529 |
| 2007/0070448 A1* | 3/2007 | Jung et al. | 358/482 |
| 2011/0128608 A1* | 6/2011 | Hsiao et al. | 359/296 |
| 2011/0176332 A1* | 7/2011 | Nam et al. | 362/613 |

* cited by examiner

*Primary Examiner* — Trung Diep
(74) *Attorney, Agent, or Firm* — Novak Druce Connolly Bove + Quigg LLP

(57) ABSTRACT

A flexible printed circuit board (FPCB) assembly includes a FPCB, a dielectric layer, a stiffener, and a conductive adhesive layer. The FPCB includes a surface and a conductive layer positioned on the surface of the FPCB. The conductive layer includes a circuit portion and a grounding portion connected to the circuit portion. The circuit portion is entirely covered by the dielectric layer and the grounding portion is exposed outside the dielectric layer. The conductive adhesive is positioned on the stiffener and includes a first adhering portion and a second adhering portion. A thickness of the second adhering portion is greater than the first adhering portion. A thickness difference between the second adhering portion and the first adhering portion is substantially equal to a thickness the dielectric layer. The first adhering portion is adhered to the dielectric layer and the second adhering portion is adhered to the grounding portion.

8 Claims, 4 Drawing Sheets

FLEXIBLE PRINTED CIRCUIT BOARD ASSEMBLY WITH STIFFENER AND CAMERA MODULE

BACKGROUND

1. Technical Field

The present disclosure relates to flexible printed circuit board (FPCB) assemblies and, particularly, to a FPCB assembly with a stiffener and a camera having the FPCB assembly.

2. Description of Related Art

Camera modules usually include a flexible printed circuit board, an image sensor, and a lens module. The image sensor and the lens module is supported by the FPCB. However, mechanical strength of the FPCB is often insufficient for support and protect the image sensor away from damages.

DETAILED DESCRIPTION

Figure 1:
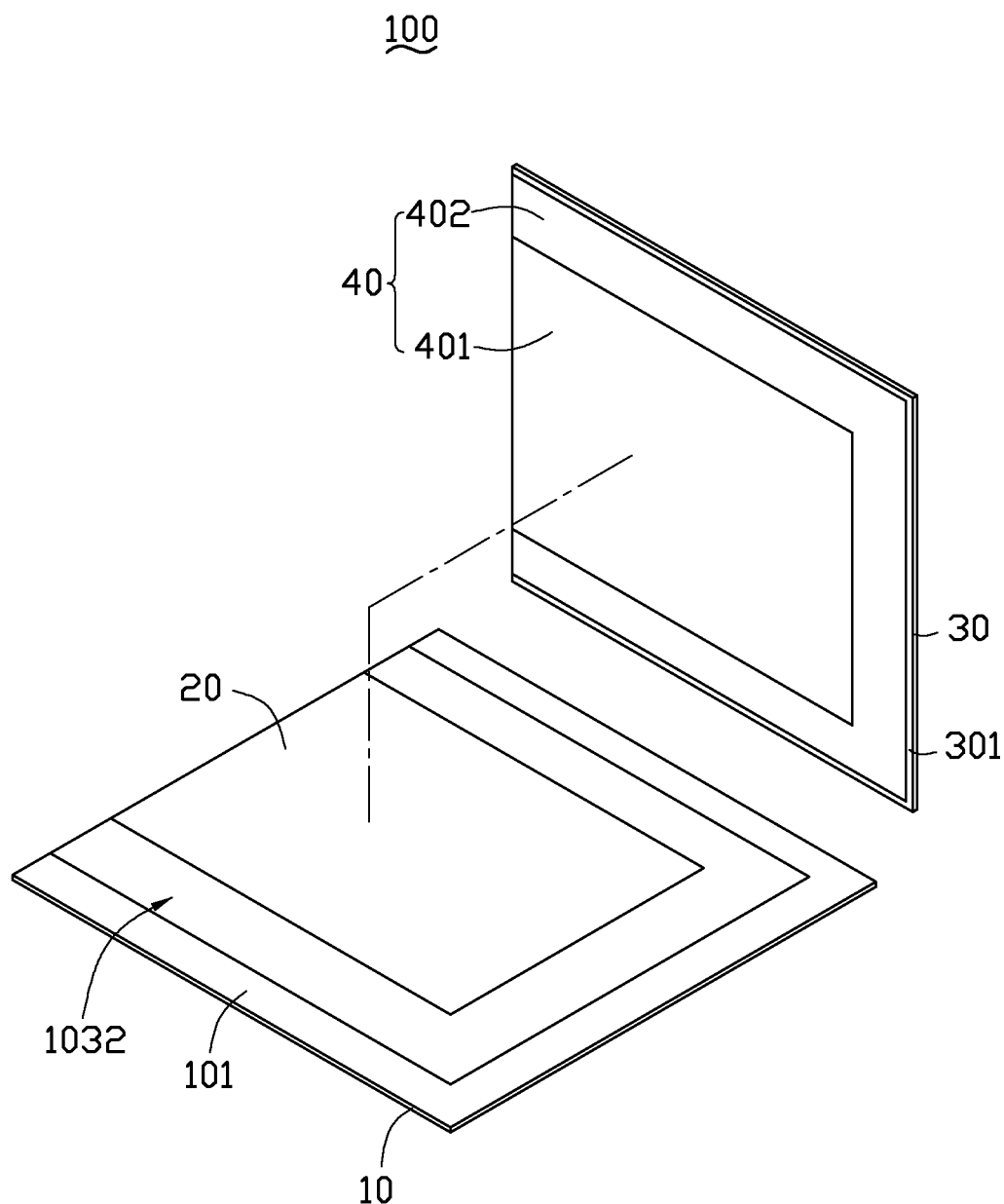
FIG. 1 is an exploded, isometric view of an FPCB assembly, according to an exemplary embodiment.
Figure 2:
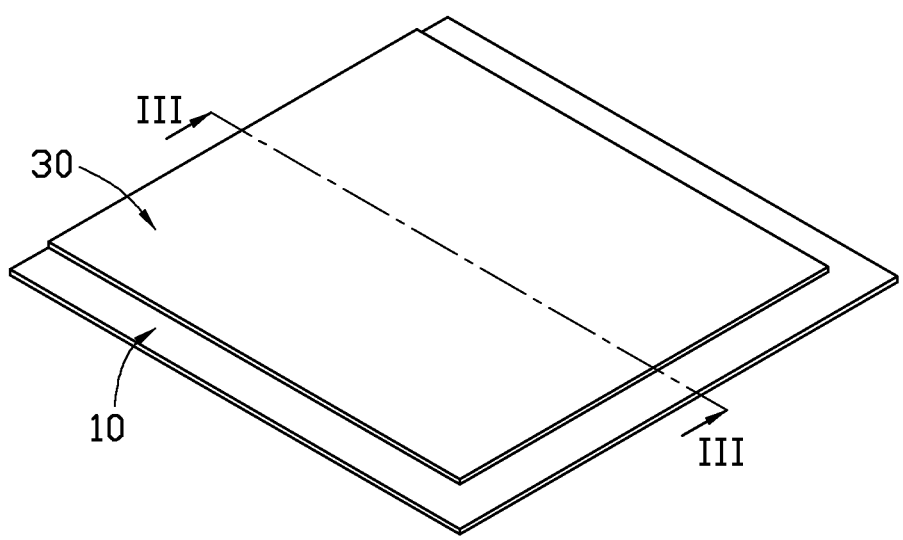
FIG. 2 is an assembled, isometric view of the FPCB assembly of FIG. 1.
Figure 3:
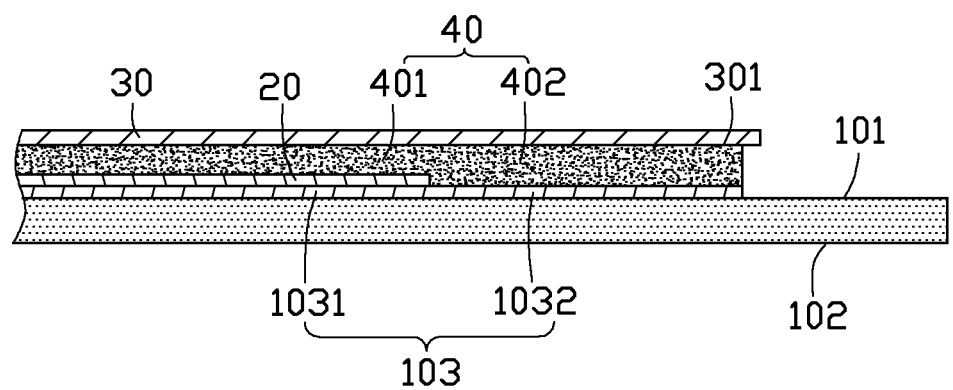
FIG. 3 is a cross-sectional view take along line III-III of FIG. 2.

FIGS. 1 to 3 show an FPCB assembly 100, according to an exemplary embodiment. The FPCB assembly 100 includes a FPCB 10, a dielectric layer 20, and a stiffener 30.

The FPCB 10 includes a first surface 101 and a second surface 102 opposite to the first surface 101. A conductive layer 103 is formed on the first surface 101. The conductive layer 103 is made of copper and formed on the first surface 101 by plating.

The dielectric layer 20 is made of resin and is substantially rectangular in shape. The dielectric layer 20 partially covers the conductive layer 103. The conductive layer 103 includes a circuit portion 1031 entirely covered by the dielectric layer 20 and a grounding portion 1032 exposed outside the dielectric layer 20 for grounding purposes. The circuit portion 1031 is laid out in certain patterns for particular circuit functions. The grounding portion 1032 is connected to the circuit portion 1031 and is substantially "U" shaped and surrounds the dielectric layer 20.

The stiffener 30 is made of metal such as stainless steel. The stiffener 30 is substantially rectangular in shape and plate-liked. The stiffener 30 includes a contact surface 301. The FPCB assembly 100 includes a layer of conductive adhesive 40 positioned on the contact surface 301. The conductive adhesive 40 is substantially rectangular and an area of the conductive adhesive 40 is smaller than an area of the contact surface 301. In the embodiment, the conductive adhesive 40 is an anisotropic conductive film (ACF), which is partially coated on the contact surface 301.

The conductive adhesive 40 includes a first adhering portion 401 and a second adhering portion 402 respectively positioned on the contact surface 301. The first adhering portion 401 is rectangular and generally positioned in the middle of the contact surface 301. The second adhering portion 402 is substantially "U" shape and surrounds and connects with the first adhering portion 401. A thickness of the second adhering portion 402 is greater than a thickness of the first adhering portion 401. In the embodiment, a thickness difference between the second adhering portion 402 and the second adhering portion 401 is substantially equal to a thickness of the dielectric layer 20. A shape of the first adhering portion 401 corresponds to the shape of the dielectric layer 20. A shape of the second adhering portion 402 corresponds to the shape of the grounding portion 1032.

In assembly, the stiffener 30 is adhered to the conductive adhesive 40 and electrically connected to the FPCB 10, wherein, the first adhering portion 401 faces and is adhered to the dielectric layer 20 and the second adhering portion 402 faces and is adhered to the grounding portion 1032. The grounding portion 1032 is electrically connected to the stiffener 30 through the conductive adhesive layer 40.

In the embodiment, because the thickness difference between the second adhering portion 402 and the first adhering portion 401 corresponds to the thickness of the dielectric layer 20. Therefore the grounding portion 1032 can be contacted with the second adhering portion 402 such that an electrically connection between the grounding portion 1032 and the stiffener 30 can be more reliable.

In alternative embodiments, the shape of the first adhering portion 401 can do not correspond to the shape of the dielectric layer 20, for example, the first adhering portion 401 is smaller than the dielectric layer 20. The first adhering portion 401 also faces and is adhered to the dielectric layer 20.

In alternative embodiments, the shape of the second adhering portion 402 do not need to correspond to the shape of the grounding portion 1032, for example, the second adhering portion 402 is smaller than the grounding portion 1032. The second adhering portion 402 also faces and is adhered to the grounding portion 1032.

In alternative embodiments, the first adhering portion 401 can disconnect with the second adhering portion 402.

In alternative embodiments, the area of the contact surface 301 can correspond to the area of the conductive adhesive layer 40.

Figure 4:
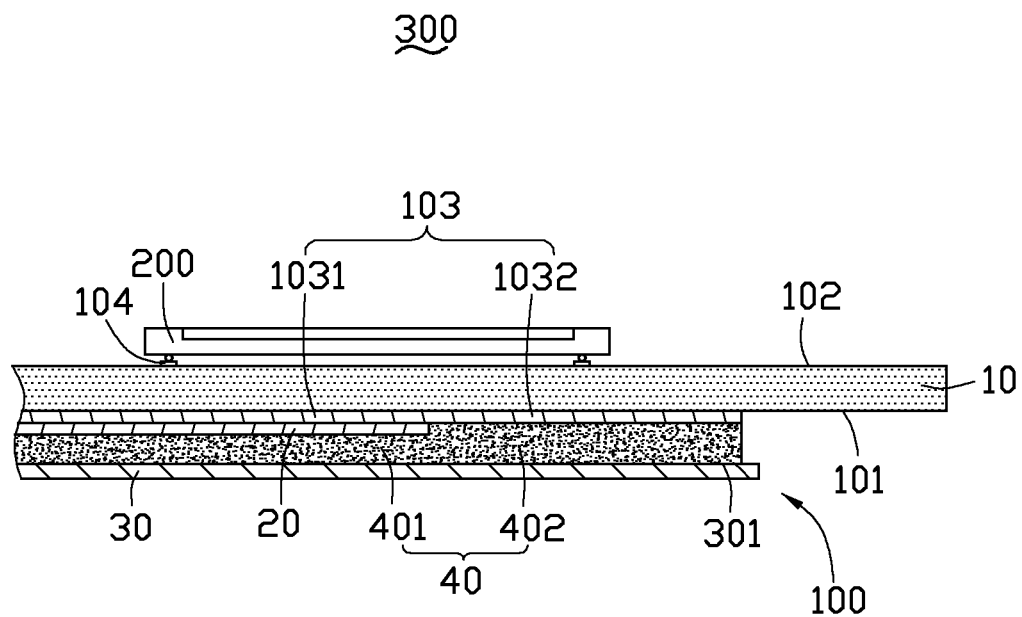
FIG. 4 is a cross-sectional view of a camera module, according to an exemplary embodiment.

FIG. 4 shows a camera module 300, according to an exemplary embodiment. The camera module 300 includes the FPCB assembly 100 and an image sensor 200. The image sensor 200 is mounted on the second surface 102. The FPCB 100 includes a number of soldering pads 104. The image sensor 200 is electrically connected to the soldering pads 104. Then a lens module (not shown) is mounted on the second surface 102 and receives the image sensor 200.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A flexible printed circuit board assembly, comprising:
    a flexible printed circuit board comprising:
        a first surface; and
        a conductive layer positioned on the first surface, the conductive layer comprising a circuit portion and a grounding portion connected to the circuit portion;
    a dielectric layer, the circuit portion entirely covered by the dielectric layer and the grounding portion exposed outside the dielectric layer;
    a stiffener comprising a contact surface; and
    a layer of conductive adhesive positioned on the contact surface, the conductive adhesive comprising a first adhering portion and a second adhering portion;
    wherein a thickness of the second adhering portion is greater than the first adhering portion, a thickness difference between the second adhering portion and the first adhering portion is substantially equal to a thickness of the dielectric layer, the first adhering portion is adhered to the dielectric layer, and the second adhering portion is adhered to the grounding portion.

2. The flexible printed circuit board assembly of claim 1, wherein the first adhering portion connects with the second adhering portion.

3. The flexible printed circuit board assembly of claim 1, wherein a shape of the dielectric layer is substantially rectangular, a shape of the first adhering portion corresponds to the shape of the dielectric layer.

4. The flexible printed circuit board assembly of claim 3, wherein the grounding portion is substantially "U" shaped, the grounding portion surrounds the dielectric layer, a shape of the second adhering portion corresponds to the shape of the grounding portion.

5. A camera module, comprising:
   a flexible printed circuit board comprising:
      a first surface and a second surface opposite to the first surface; and
      a conductive layer positioned on the first surface, the conductive layer comprising a circuit portion and a grounding portion connected to the circuit portion;
   a dielectric layer, the circuit portion entirely covered by the dielectric layer and the grounding portion exposed outside the dielectric layer;
   a stiffener comprising a contact surface; and
   a layer of conductive adhesive positioned on the contact surface, the conductive adhesive comprising a first adhering portion and a second adhering portion; a thickness of the second adhering portion being greater than the first adhering portion, a thickness difference between the second adhering portion and the first adhering portion being substantially equal to a thickness of the dielectric layer, the first adhering portion being adhered to the dielectric layer and the second adhering portion being adhered to the grounding portion; and
   an image sensor mounted on the second surface.

6. The camera module of claim 5, wherein the first adhering portion connects with the second adhering portion.

7. The camera module of claim 5, wherein a shape of the dielectric layer is substantially rectangular, a shape of the first adhering portion corresponds to the shape of the dielectric layer.

8. The camera module of claim 7, wherein the grounding portion is substantially "U" shaped, the grounding portion surrounds the dielectric layer, a shape of the second adhering portion corresponds to the shape of the grounding portion.

* * * * *